United States Patent
Morii (10) Patent No.: US 10,985,735 B2
(45) Date of Patent: Apr. 20, 2021

(54) IMPEDANCE MATCHING DEVICE AND IMPEDANCE MATCHING METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 16/722,742

(22) Filed: Dec. 20, 2019

(65) Prior Publication Data

US 2020/0212892 A1 Jul. 2, 2020

(30) Foreign Application Priority Data

Dec. 27, 2018 (JP) .............................. JP2018-245076

(51) Int. Cl.
*H03H 11/30* (2006.01)
*H01J 37/32* (2006.01)

(52) U.S. Cl.
CPC ....... *H03H 11/30* (2013.01); *H01J 37/32183* (2013.01); *H01J 2237/334* (2013.01); *H01J 2237/3321* (2013.01)

(58) Field of Classification Search
CPC ................ H03H 11/30; H01J 37/32183; H01J 2237/3321; H01J 2237/334
See application file for complete search history.

(56) References Cited

U.S. PATENT DOCUMENTS

| | | | |
|---|---|---|---|
| 5,654,679 A * | 8/1997 | Mavretic | H03H 7/40 333/17.3 |
| 6,677,828 B1 | 1/2004 | Harnett et al. | |
| 7,251,121 B2 | 7/2007 | Bhutta | |
| 7,298,128 B2 | 11/2007 | Bhutta | |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |

(Continued)

FOREIGN PATENT DOCUMENTS

| | | | |
|---|---|---|---|
| JP | 2010-103123 A | 5/2010 | |
| JP | 2012-142285 A | 7/2012 | |

*Primary Examiner* — Kurtis R Bahr (74) *Attorney, Agent, or Firm* — Rudy J. Ng; Bret E. Field; Bozicevic, Field & Francis LLP (57) ABSTRACT

An impedance matching device includes: a variable capacitor in which a plurality of series circuits of capacitors and semiconductor switches are connected in parallel; a calculation unit that calculates an impedance or a reflection coefficient on the load side using information regarding impedance acquired from the outside; and a control unit that determines ON/OFF states to be taken by the semiconductor switches included in the variable capacitor using the impedance or the reflection coefficient calculated by the calculation unit and turns on or off the semiconductor switches based on the determined states. The control unit changes an ON/OFF control timing between one and another of the semiconductor switches.

6 Claims, 9 Drawing Sheets

(56) References Cited

U.S. PATENT DOCUMENTS

| | | |
|---|---|---|
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 * | 7/2019 | Mavretic ................ H02M 1/08 |
| 10,431,424 B2 * | 10/2019 | Mavretic ............ H01L 29/2003 |
| 10,431,428 B2 * | 10/2019 | Bhutta ............. H01J 37/32935 |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 * | 11/2019 | Bhutta .................. H03H 11/28 |
| 2008/0179948 A1 * | 7/2008 | Nagarkatti ............. H03F 3/195 |
| | | 307/18 |
| 2012/0168081 A1 * | 7/2012 | Son ................. H01J 37/32183 |
| | | 156/345.28 |
| 2015/0349750 A1 * | 12/2015 | Van Zyl ................. H03H 7/38 |
| | | 315/111.21 |
| 2016/0065207 A1 | 3/2016 | Bhutta |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |

\* cited by examiner

IMPEDANCE MATCHING DEVICE AND IMPEDANCE MATCHING METHOD

CROSS-REFERENCE TO RELATED APPLICATION

This non-provisional application claims priority under 35 U.S.C. § 119(a) on Patent Application No. 2018-245076 filed in Japan on Dec. 27, 2018, the entire contents of which are hereby incorporated by reference.

FIELD

The present disclosure relates to an impedance matching device and an impedance matching method for matching the impedance of a high frequency power supply and the impedance of a load with each other.

BACKGROUND

In the case of supplying power from a high frequency power supply to a load whose impedance changes, such as a plasma processing apparatus, an impedance matching device that matches the output impedance of the high frequency power supply with an impedance as the load side is viewed from the high frequency power supply is used in order to efficiently supply the power to the load (for example, refer to Japanese Patent Laid-Open Publication No. 2012-142285).

The impedance matching device described in Japanese Patent Laid-Open Publication No. 2012-142285 includes a variable capacitor in which a plurality of series circuits of capacitors and semiconductor switches are connected in parallel. The semiconductor switches are P-Intrinsic-N (PIN) diodes. The impedance matching device is provided between the high frequency power supply and the load.

The impedance matching device described in Japanese Patent Laid-Open Publication No. 2012-142285 is configured to perform impedance matching by adjusting the capacitance of the variable capacitor by switching (turning on and off) the semiconductor switches with a control signal of a controller.

In the case of using a semiconductor switch that controls switching of a high frequency signal by applying a DC voltage to electrodes at both ends, such as a PIN diode, a choke coil (inductor) is used to separate a DC voltage application circuit in a high frequency manner from an electrode to which a high frequency signal is applied (refer to Japanese Patent Laid-Open Publication No. 2010-103123, for example).

However, in a case where each PIN diode included in the variable capacitor described in Japanese Patent Laid-Open Publication No. 2012-142285 is separated in a high frequency manner from the controller by a corresponding choke coil, noise is superimposed on the electrodes of the PIN diode due to electromagnetic coupling between choke coils depending on the arrangement of the choke coils. In particular, in a case where a plurality of PIN diodes are controlled to be turned on or off at the same time, a phenomenon that the ON/OFF operation of the PIN diodes becomes unstable may be observed.

SUMMARY

It is an object of the disclosure to provide an impedance matching device and an impedance matching method capable of preventing an unstable ON/OFF operation due to noise of semiconductor switches for switching the high frequency signal.

An impedance matching device according to an aspect of the disclosure is an impedance matching device that is provided between a high frequency power supply and a load and acquires information regarding an impedance as the load side is viewed from an output end of the high frequency power supply or a portion equivalent to the output end and performs impedance matching between the high frequency power supply and the load, the device comprising: a variable capacitor in which a plurality of series circuits of capacitors and semiconductor switches are connected in parallel; a calculation unit that calculates an impedance or a reflection coefficient on the load side using the acquired information regarding the impedance; and a control unit that determines ON/OFF states to be taken by the semiconductor switches included in the variable capacitor using the impedance or the reflection coefficient calculated by the calculation unit and turns on or off the semiconductor switches based on the determined states, wherein the control unit changes an ON/OFF control timing between one and another of the semiconductor switches.

An impedance matching method according to another aspect of the disclosure is an impedance matching method for performing impedance matching between a high frequency power supply and a load using a variable capacitor which is provided between the high frequency power supply and the load and in which a plurality of series circuits of capacitors and semiconductor switches are connected in parallel, the method comprising: acquiring information regarding an impedance as the load side is viewed from an output end of the high frequency power supply or a portion equivalent to the output end; calculating an impedance or a reflection coefficient on the load side using the acquired information regarding the impedance; determining ON/OFF states to be taken by the semiconductor switches included in the variable capacitor using the calculated impedance or reflection coefficient; and changing an ON/OFF control timing between one and another of the semiconductor switches in a case of turning on or off the semiconductor switches based on the determined states.

According to this aspect, the variable capacitor in which a plurality of series circuits of capacitors and semiconductor switches are connected in parallel is provided between the high frequency power supply and the load, the information regarding the impedance or the reflection coefficient as the load side is viewed from the output end of the high frequency power supply or a portion equivalent to the output end is acquired from the outside, and the current impedance or reflection coefficient on the load side is calculated using the acquired information. In addition, the portion equivalent to the output end of the high frequency power supply is, for example, an input end of the impedance matching device. In a case where the impedance on the load side is calculated, in order to adjust the capacitance of the variable capacitor so that the impedance on the load side after adjustment approaches the output impedance of the high frequency power supply, an ON/OFF state to be taken by each semiconductor switch is determined. On the other hand, in a case where the reflection coefficient is calculated, in order to adjust the capacitance of the variable capacitor so that the actual reflection coefficient approaches 0, an ON/OFF state to be taken by each semiconductor switch is determined. Then, in the case of newly adjusting the actual ON/OFF state of each semiconductor switch so as to correspond to the determined ON/OFF state, a time difference is set for the ON/OFF control timing between a part and another part of all of the semiconductor switches. Then, for example, between semiconductor switches that may lead to unstable operation during ON/OFF control due to the arrangement relationship in the device, the ON/OFF control timings do not match each other.

In the impedance matching device according to the aspect of the disclosure, the control unit changes an ON/OFF timing by a predetermined time for each of the semiconductor switches.

According to this aspect, for all the semiconductor switches, a predetermined time difference is sequentially set for the ON/OFF control timing. Therefore, since no two semiconductor switches are controlled to be turned on or off at the same time, it is prevented that the controls interfere with each other.

In the impedance matching device according to the aspect of the disclosure, the control unit stores ON/OFF states of the semiconductor switches, extracts semiconductor switches whose ON/OFF states are to be changed based on the stored ON/OFF states and the determined ON/OFF states, and changes an ON/OFF timing between one and another of the extracted semiconductor switches.

According to this aspect, the current ON/OFF state of each semiconductor switch is stored, and semiconductor switches whose ON/OFF states are to be changed are extracted by comparing the stored ON/OFF state with the determined ON/OFF state. Then, a time difference is set for the ON/OFF control timing between a part and another part of the extracted semiconductor switches.

Therefore, only for semiconductor switches whose ON/OFF states change, a time difference in ON/OFF control is set. As a result, in a case where there are a small number of semiconductor switches whose ON/OFF states change, the total time required to change the states is shortened.

In the impedance matching device according to the aspect of the disclosure, some or all of the capacitors included in the variable capacitor have stepwise different capacitances.

According to this aspect, at least some of the capacitors included in the variable capacitor have stepwise different capacitances. Therefore, the adjustment range of the capacitance by the combination of capacitors connected in parallel can be made relatively large.

In the impedance matching device according to the aspect of the disclosure, the control unit turns on or off corresponding semiconductor switches in descending or ascending order of the capacitances of the capacitors.

According to this aspect, corresponding semiconductor switches are controlled to be turned on or off in descending order of the capacitances of the capacitors included in the variable capacitor, or corresponding semiconductor switches are controlled to be turned on or off in ascending order of the capacitances of the capacitors included in the variable capacitor. In a case where the corresponding semiconductor switches are controlled to be turned on or off in descending order of the capacitance, the capacitance of the variable capacitor is adjusted so as to converge toward the target capacitance. In a case where the corresponding semiconductor switches are controlled to be turned on or off in ascending order of the capacitance, the capacitance of the variable capacitor is quickly adjusted toward the target capacitance in a region where the change in the target capacitance is small.

According to the disclosure, it is possible to prevent an unstable ON/OFF operation due to noise of the semiconductor switches for switching the high frequency signal.

DETAILED DESCRIPTION

Hereinafter, the disclosure will be described in detail with reference to the diagrams illustrating embodiments thereof.

First Embodiment

Figure 1:
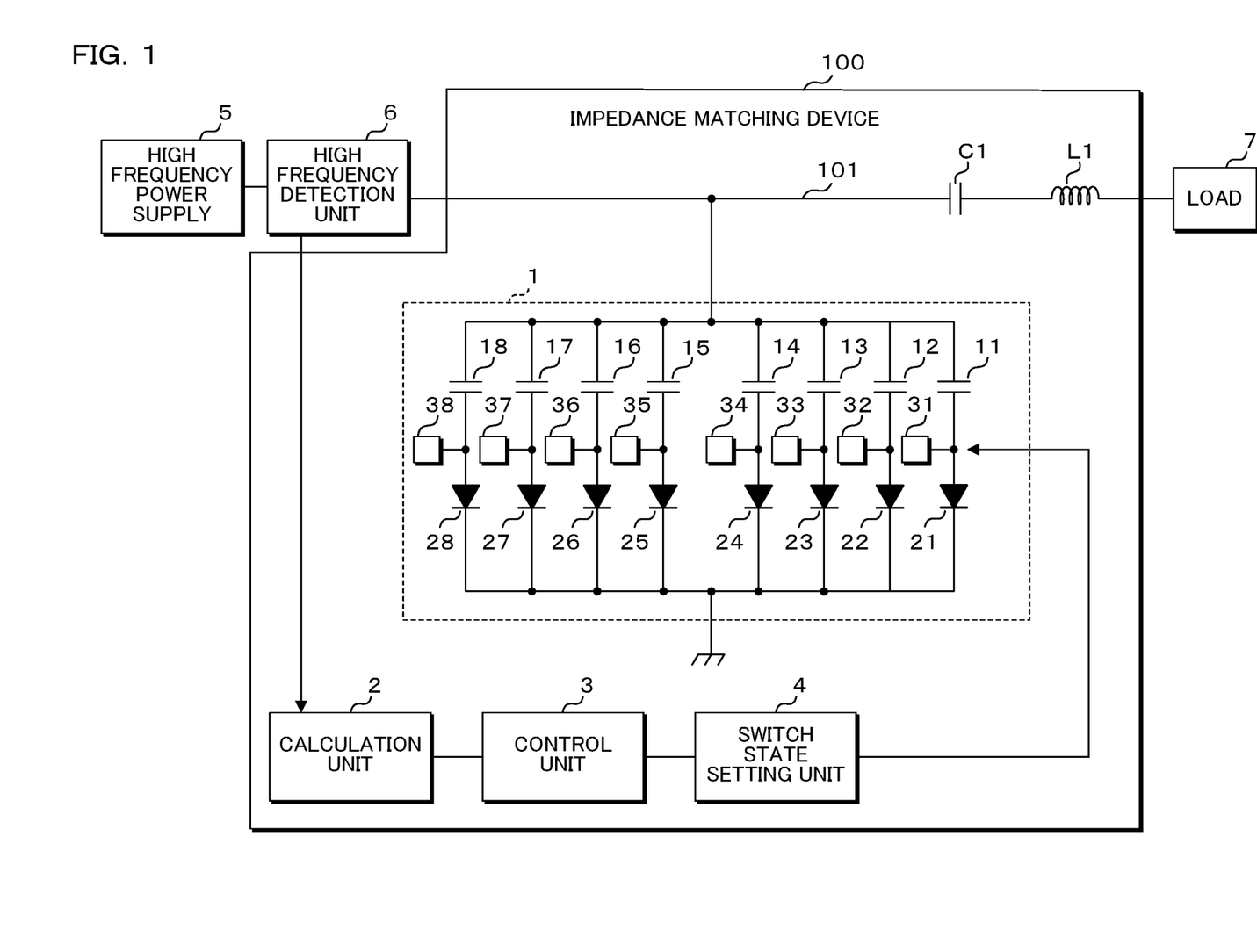
FIG. 1 is a block diagram illustrating an example of the configuration of an impedance matching device according to a first embodiment.

FIG. 1 is a block diagram illustrating an example of the configuration of an impedance matching device 100 according to a first embodiment. The impedance matching device 100 is provided between a high frequency power supply 5 that outputs high frequency power and a load 7 that consumes high frequency power.

Between the high frequency power supply 5 and the impedance matching device 100, a high frequency detection unit 6 that allows high frequency power to pass therethrough and detects parameters, such as a high frequency voltage, is connected. That is, the high frequency detection unit 6 is interposed between the output end of the high frequency power supply 5 and the input end of the impedance matching device 100. The high frequency detection unit 6 may be included in the impedance matching device 100.

The high frequency power supply 5 is an AC power supply that outputs high frequency power in an industrial radio frequency (RF) band, such as 2 MHz, 13.56 MHz, 27 MHz, and 60 MHz, and the output impedance is set to a specified value, such as 50Ω. The high frequency power supply 5 includes an inverter circuit (not illustrated), and generates high frequency AC power by performing switching control of the inverter circuit.

The high frequency detection unit 6 detects parameters for calculating the impedance when the load 7 side is viewed from the output end of the high frequency power supply 5 or the input end of the impedance matching device 100 that is a portion equivalent to the output end (hereinafter, simply referred to as when the load 7 side is viewed or on the load 7 side) or parameters (corresponding to information regarding impedance) for calculating a reflection coefficient when the load 7 side is viewed. The impedance when the load 7 side is viewed is a combined impedance of the impedance of the load 7 and the impedance of the impedance matching device 100. Specifically, the high frequency detection unit 6 detects a high frequency voltage, a high frequency current, and a phase difference between the high frequency voltage and the high frequency current at its own position as parameters. Alternatively, the high frequency detection unit 6 detects high frequency traveling wave power (or traveling wave voltage) toward the load 7 and reflected wave power (or reflected wave voltage) reflected and returned from the load 7 as parameters. Using these detected parameters, a calculation unit 2 to be described later calculates an impedance or a reflection coefficient on the load 7 side based on a known method.

The load 7 performs various kinds of processing using the high frequency power supplied from the high frequency power supply 5, and examples thereof include a plasma processing apparatus and a non-contact power transmission apparatus. In the plasma processing apparatus, the state of plasma changes from moment to moment as the manufacturing process, such as plasma etching and plasma CVD, proceeds. As a result, the impedance of the load 7 changes.

The impedance matching device 100 includes a variable capacitor 1 having a variable capacitance, the calculation unit 2 that acquires the parameters from the high frequency detection unit 6 and calculates an impedance or a reflection coefficient on the load 7 side, and a control unit 3 that controls the capacitance of the variable capacitor 1 using the impedance or the reflection coefficient calculated by the calculation unit 2. The impedance matching device 100 further includes a switch state setting unit 4 that sets a semiconductor switch, which will be described later, provided in the variable capacitor 1 to ON/OFF, so that the control unit 3 controls the capacitance of the variable capacitor 1 through the switch state setting unit 4.

In the impedance matching device 100, a transmission line 101 extending to the high frequency detection unit 6 and a series circuit of a capacitor C1 and an inductor L1 whose one end on the inductor L1 side is connected to the load 7 are connected in cascade. The variable capacitor 1 is substantially a two-terminal circuit, one end of which is connected to the transmission line 101 and the other end is connected to the ground potential. That is, the variable capacitor 1 and the series circuit of the capacitor C1 and the inductor L1 form an L type matching circuit. The capacitor C1 may be replaced with another variable capacitor 1.

Here, a case in which the matching circuit is an L type has been described, but the matching circuit may be an inverted L type, T type, or it type. In addition, the series circuit of the capacitor C1 and the inductor L1 may be connected to the outside of the impedance matching device 100 (that is, between the impedance matching device 100 and the load 7). Hereinafter, a portion where high frequency power is input from the high frequency detection unit 6 to the transmission line 101 will be referred to as an input portion. In addition, a portion where high frequency power is output from the inductor L1 to the load 7 will be referred to as an output portion.

The variable capacitor 1 includes capacitors 11, 12, ..., 18 whose one ends are connected to the transmission line 101, semiconductor switches 21, 22, ..., 28 that are PIN diodes whose anodes are connected to the other ends of the capacitors 11, 12, ..., 18, and driving circuits 31, 32, ..., 38. Cathodes (the other ends) of the semiconductor switches 21, 22, ..., 28 are connected to the ground potential. Output terminals Out (refer to FIG. 2 described later) of the driving circuits 31, 32, ..., 38 are connected to connection points between the capacitors 11, 12, ..., 18 and the semiconductor switches 21, 22, ..., 28. The number of capacitors 11, 12, ..., 18, the number of semiconductor switches 21, 22, ..., 28, and the number of driving circuits 31, 32, ..., 38 are not limited to eight.

Figure 2:
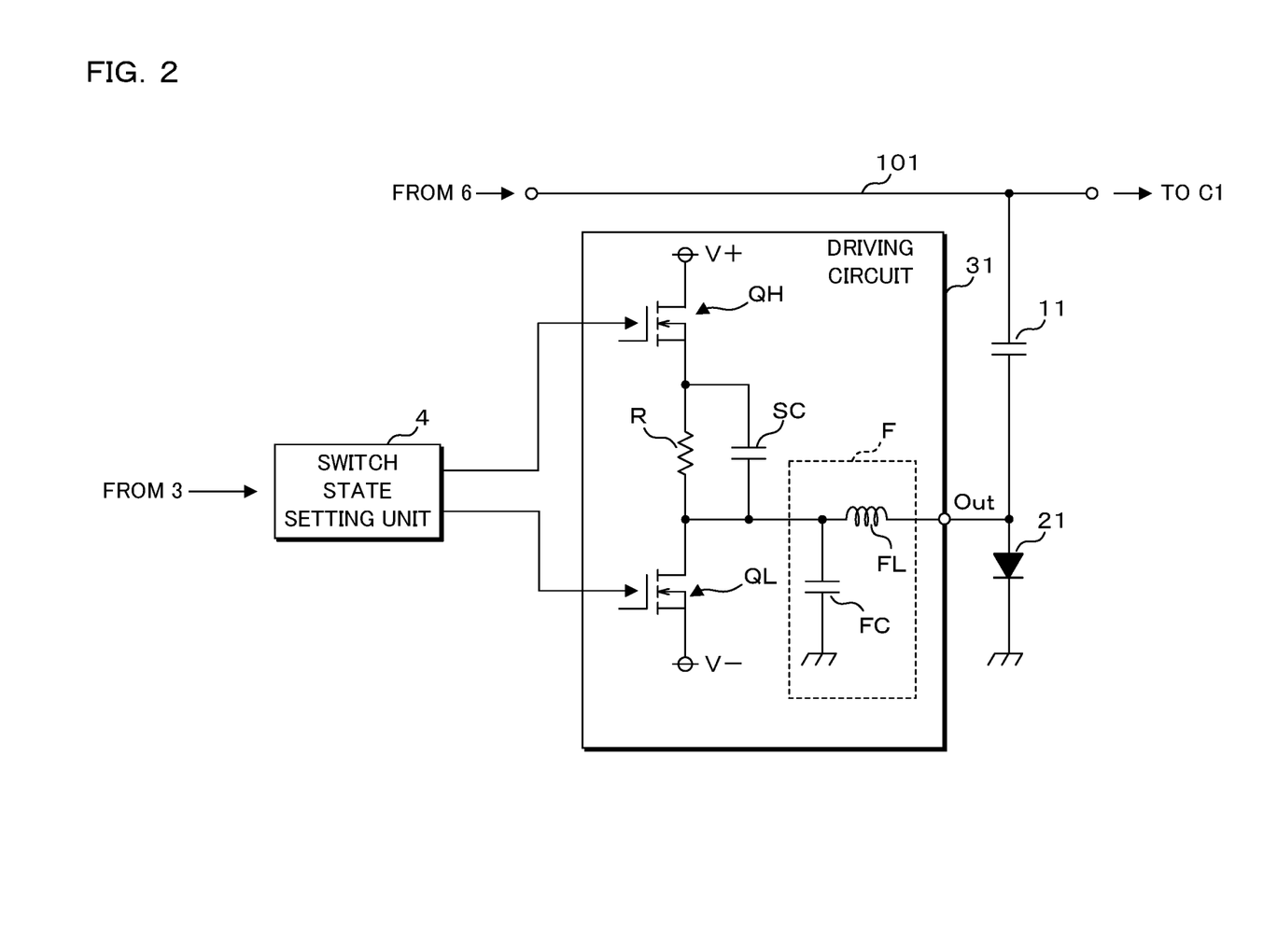
FIG. 2 is a circuit diagram illustrating an example of the configuration of a driving circuit.

FIG. 2 is a circuit diagram illustrating an example of the configuration of the driving circuit 31. The same applies to the other driving circuits 32, 33, ..., 38. The driving circuit 31 includes an N channel type metal oxide semiconductor field effect transistor (MOSFET: hereinafter, referred to as a transistor) QH whose drain is connected to a positive power supply V+ and an N channel type transistor QL whose source is connected to a negative power supply V−. Between the source of the transistor QH and the drain of the transistor QH, a parallel circuit of a resistor R and a speed-up capacitor SC are connected. The transistors QH and QL may be other switching elements, such as an insulated gate bipolar transistor (IGBT).

The driving circuit 31 further includes an L type filter F including a capacitor FC, which is connected between the drain of the transistor QL and the ground potential, and an inductor FL, which is connected between the drain of the transistor QL and an output terminal Out. High level and low level complementary driving signals are applied from the switch state setting unit 4 to the gate of the transistor QH and the gate of the transistor QL. The voltage of the high level driving signal may be equal to the voltage of the positive power supply V+, for example. The voltage of the low level driving signal may be equal to the voltage of the negative power supply V−, for example.

In a case where a low level driving signal is applied to the gate of the transistor QL and a high level driving signal is applied to the gate of the transistor QH, the transistor QL is turned off and the transistor QH is turned on. Then, a forward current flows from the positive power supply V+ to the semiconductor switch 21 through the transistor QH, the resistor R, the speed-up capacitor SC, and the inductor FL included in the filter F, so that the semiconductor switch 21 is turned on. As a result, the capacitance of the capacitor 11 is included in the capacitance of the entire variable capacitor 1.

On the other hand, in a case where a low level driving signal is applied to the gate of the transistor QH and a high level driving signal is applied to the gate of the transistor QL, the transistor QH is turned off and the transistor QL is turned on. Then, a backward current is applied from the negative power supply V− to the anode of the semiconductor switch 21 through the transistor QL and the inductor FL, so that the semiconductor switch 21 is turned off. As a result, the capacitance of the capacitor 11 is not included in the capacitance of the entire variable capacitor 1. As described above, the capacitance of the variable capacitor 1 is adjusted.

Returning to FIG. 1, in the first embodiment, the capacitance of some or all of the capacitors 11, 12, ..., 18 increases in a stepwise manner. More specifically, assuming that the capacitance of the capacitor 11 is Cmin, it is preferable that the capacitances of the capacitors 11, 12, ..., 18 are expressed by $Cmin \times 2^{i-1}$ (i=1, 2, ..., 8). In this manner, the capacitance of the variable capacitor 1 can be set to $2^8$ magnitudes in increments of Cmin.

The calculation unit 2 includes, for example, a field programmable gate array (FPGA), and acquires parameters for calculating the impedance on the load 7 side or parameters for calculating the reflection coefficient on the load 7 side from the high frequency detection unit 6. The calculation unit 2 calculates and averages the impedance or the reflection coefficient on the load 7 side using the acquired parameters, and outputs the averaged impedance or reflection coefficient to the control unit 3.

The control unit 3 includes a central processing unit (CPU) (not illustrated), and controls the operation of each unit according to a control program stored in advance in a read only memory (ROM) and performs processing, such as input and output, calculation, and time measurement. A computer program that defines the procedure of each process by the CPU may be loaded in advance into a random access memory (RAM) using means (not illustrated), and the loaded computer program may be executed by the CPU. Alternatively, the control unit 3 may be configured by a microcomputer or a dedicated hardware circuit.

The control unit 3 acquires the impedance or the reflection coefficient on the load 7 side that has been calculated by the calculation unit 2. In a case where the impedance on the load 7 side is acquired, the control unit 3 determines the combination of the capacitors 11, 12, . . . , 18 of the variable capacitor 1 so that the impedance on the load 7 side matches the output impedance of the high frequency power supply 5. On the other hand, in a case where the reflection coefficient on the load 7 side is acquired, the control unit 3 determines the combination of the capacitors 11, 12, . . . , 18 of the variable capacitor 1 so that the reflection coefficient at the input portion approaches 0. If the magnitude of the reflection coefficient falls within the allowable range, it is considered that matching has been realized. By such control, power is efficiently supplied from the high frequency power supply 5 to the load 7. The following description will be given on the assumption that the calculation unit 2 calculates the impedance on the load 7 side and the control unit 3 determines the combination of the capacitors 11, 12, . . . , 18 by calculating the capacitance of the variable capacitor 1 using the calculated impedance. The determined combination of the capacitors 11, 12, . . . , 18 corresponds to ON/OFF states to be taken by the semiconductor switches 21, 22, . . . , 28.

The switch state setting unit 4 sets the ON/OFF states of the semiconductor switches 21, 22, . . . , 28 according to the combination of the capacitors 11, 12, . . . , 18 determined by the control unit 3, that is, ON/OFF states to be taken by the semiconductor switches 21, 22, . . . , 28. In a case where the ON/OFF states of the semiconductor switches 21, 22, . . . , 28 are set by the switch state setting unit 4, the above-described complementary driving signals are applied to the corresponding driving circuits 31, 32, . . . , 38. As a result, the ON/OFF states of the semiconductor switches 21, 22, . . . , 28 of the variable capacitor 1 are newly controlled. Then, the capacitance of the variable capacitor 1 is adjusted to the capacitance calculated by the control unit 3.

Figure 3:
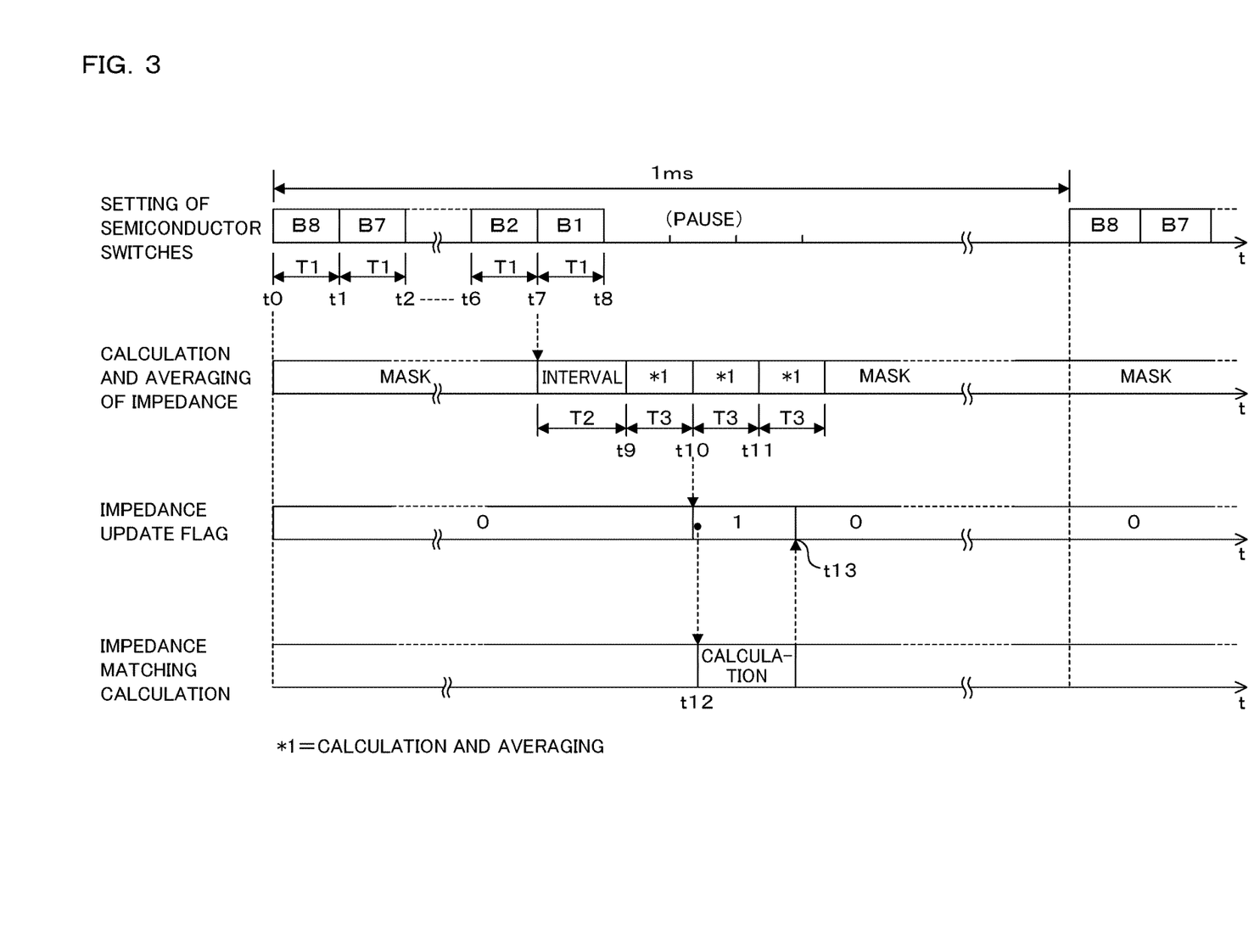
FIG. 3 is a timing chart showing the operation of the impedance matching device according to the first embodiment.

Next, the operation flow of the entire impedance matching device 100 will be described. FIG. 3 is a timing chart showing the operation of the impedance matching device 100 according to the first embodiment. The four timing charts shown in FIG. 3 all have the same time axis (t) as the horizontal axis. In order from the top, timings for performing setting of the semiconductor switches 21, 22, . . . , 28, calculation and averaging of the impedance on the load 7 side, setting and clearing of an impedance update flag, and impedance matching calculation are schematically shown. In FIG. 3, B1 to B7 indicate the bit numbers of the semiconductor switches 21, 22, . . . , 28.

In the impedance matching device 100 according to the first embodiment, the sequence shown in FIG. 3 appears periodically, for example, once every 1 ms, but the period of the sequence is not limited to 1 ms. During this 1 ms, the capacitance of the variable capacitor 1 is calculated once, and the bits of the semiconductor switches 21, 22, . . . , 28 are set to ON or OFF based on the calculated capacitance. Among the operations corresponding to the timing charts shown in FIG. 3, the calculation and averaging of impedance and the setting and clearing of the impedance update flag are executed by the FPGA included in the calculation unit 2 (hereinafter, simply referred to as an FPGA), and operations corresponding to the other two timing charts are executed by the CPU provided in the control unit 3 (hereinafter, simply referred to as a CPU).

The settings of the semiconductor switches 21, 22, . . . , 28 performed from time t0 to time t8 are executed by the CPU every time T1 according to the ON/OFF state determined in the immediately preceding period starting 1 ms before the time t0.

Here, the semiconductor switches 21, 22, . . . , 28 are set in descending order of the bit numbers from the semiconductor switch 28 that is the most significant bit, but may be set in ascending order of the bit numbers from the semiconductor switch 21 that is the least significant bit. The settings of the semiconductor switches 21, 22, . . . , 28 are performed at the early stage of time T1. The length of the time T1 is, for example, 4 µs at the shortest. The CPU applies a mask signal to the FPGA, and turns off the mask signal when the setting of the semiconductor switch 21 (corresponding to B1) executed at time t7 is completed.

One FPGA senses the mask signal applied from the CPU, and sets an interval of time T2 from when the mask signal is turned off to when the calculation and averaging of the impedance on the load 7 side are started. The length of the time T2 is, for example, 30 µs. This interval is a time to wait until the impedance on the load 7 side is stabilized by the setting of the semiconductor switch 21 executed immediately after time t7.

In a case where the above interval ends at time t9, the FPGA acquires a parameter for calculating the impedance on the load 7 side from the high frequency detection unit 6 multiple times during time T3, and calculates and averages the impedance on the load 7 side each time the parameter is acquired. The length of the time T3 is, for example, 15 µs. In a case where the first calculation and averaging end at time t10, the FPGA sets the impedance update flag cleared by the CPU before time t0 to 1. Thereafter, the FPGA repeats the calculation and averaging of the impedance on the load 7 side during time T3 starting from time t10 and time t11. The calculation and averaging are repeated until the mask signal is turned on by the CPU.

The CPU senses the impedance update flag set by the FPGA, and does not perform a matching calculation while the update flag is cleared to 0. In a case where the CPU senses that the impedance update flag is set to 1 at time t12, the CPU performs an impedance matching calculation and clears the impedance update flag to 0 at time t13 at which the matching calculation ends. Then the CPU turns on the mask signal applied to the FPGA. The matching calculation herein is processing for acquiring the averaged impedance on the load 7 side from the FPGA, calculating the capacitance of the variable capacitor 1 so that the impedance on the load 7 side matches the output impedance of the high frequency power supply 5, and determining the ON/OFF states to be taken by the semiconductor switches 21, 22, . . . , 28.

Hereinafter, the operations of the calculation unit 2 and the control unit 3 described above will be described with reference to the flowcharts illustrating the operations. FIG.

Figure 4:
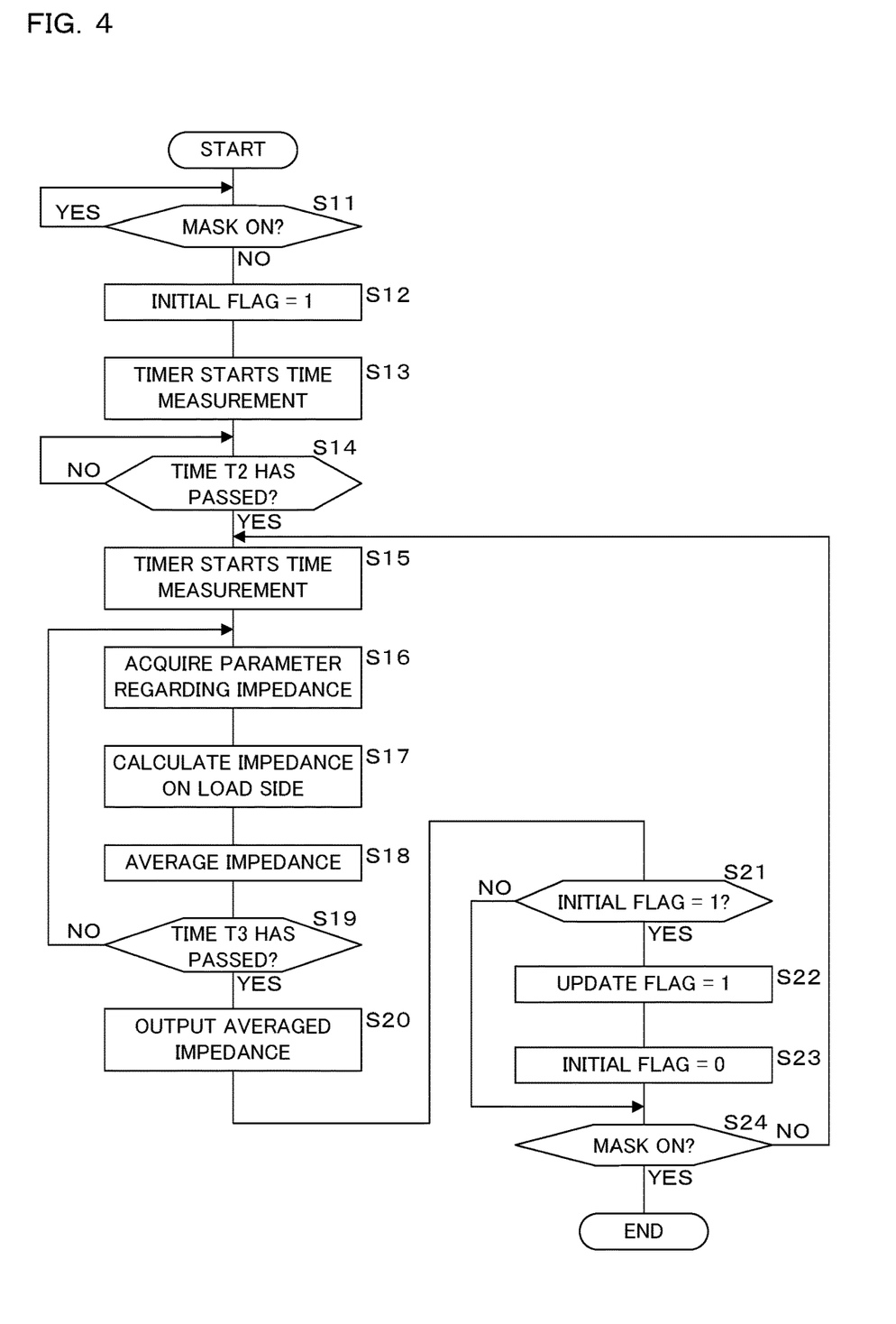
FIG. 4 is a flowchart illustrating the processing procedure of an FPGA that calculates and averages the impedance on the load side.
Figure 5:
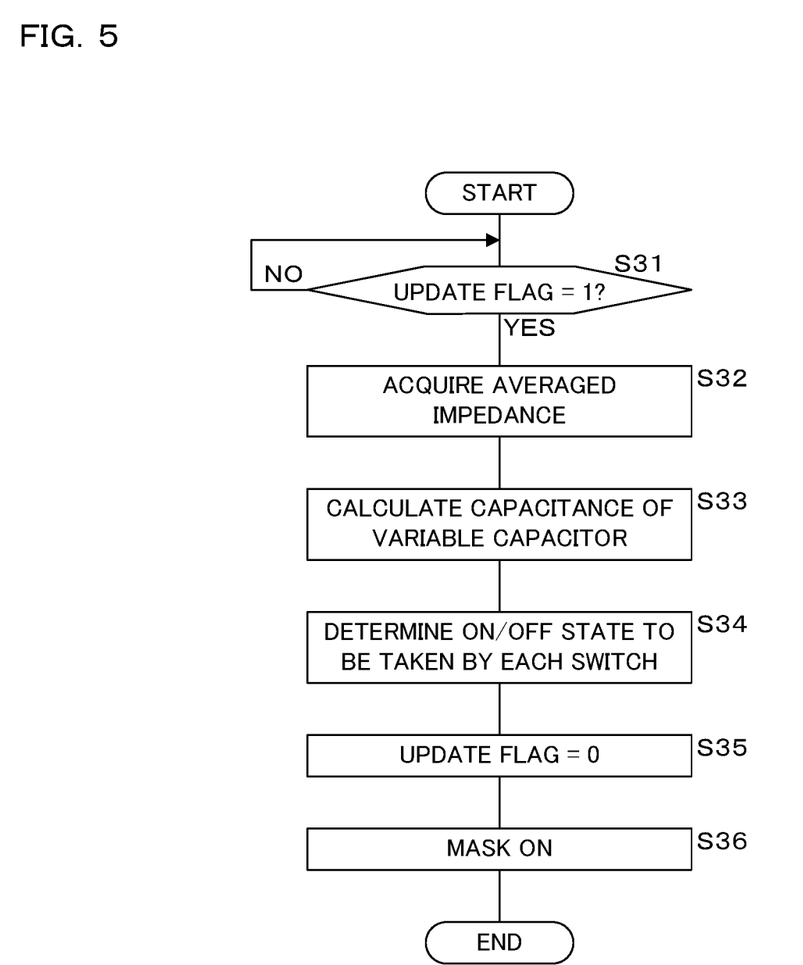
FIG. 5 is a flowchart illustrating the processing procedure of a CPU that performs an impedance matching operation.
Figure 6:
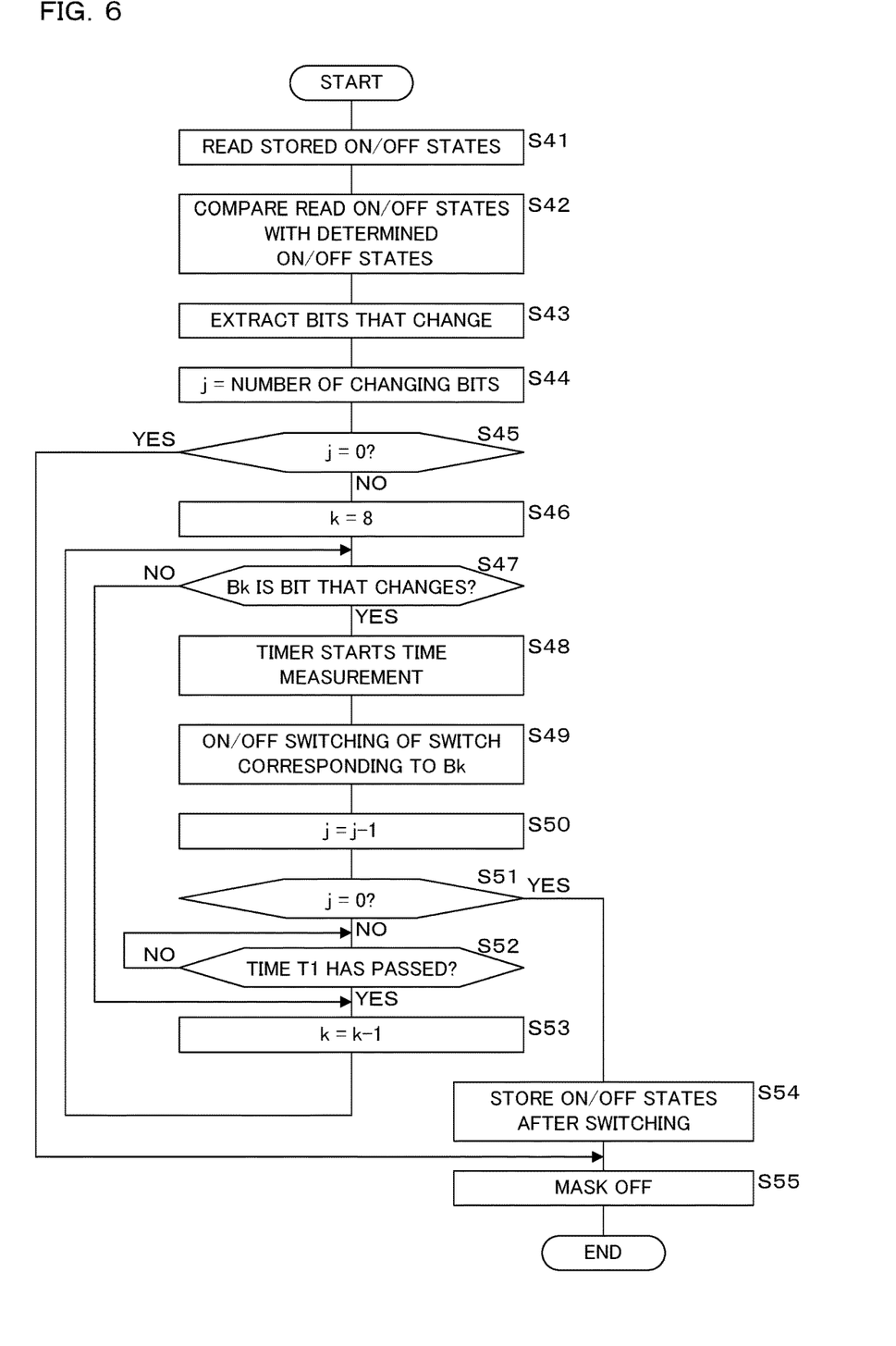
FIG. 6 is a flowchart illustrating the processing procedure of a CPU for switching ON/OFF of semiconductor switches in the impedance matching device according to the first embodiment.

4 is a flowchart illustrating the processing procedure of the FPGA that calculates and averages the impedance on the load 7 side. FIG. 5 is a flowchart illustrating the processing procedure of the CPU that performs an impedance matching calculation. FIG. 6 is a flowchart illustrating the processing procedure of the CPU for switching ON/OFF of the semiconductor switches 21, 22, . . . , 28 in the impedance matching device 100 according to the first embodiment. The process shown in FIG. 4 is started with an interval sufficiently shorter than 1 ms, for example, and is executed by the FPGA. The processes shown in FIGS. 5 and 6 are started simultaneously, for example, every 1 ms, and executed by the CPU according to a computer program stored in advance in a ROM (not illustrated).

In FIGS. 4 and 5, the impedance update flag is simply referred to as an update flag. The initial value of the update flag is 0. In FIGS. 4 and 6, the mask signal is simply referred to as a mask. The initial value of the mask signal is ON. In FIGS. 5 and 6, the semiconductor switch is simply referred to as a switch. The initial flag in FIG. 4 is a flag indicating that this is the first processing for calculating and averaging the impedance. In FIG. 6, j is for storing the number of changing bits among the semiconductor switches 21, 22, . . . , 28, and k is for storing the bit number under processing.

In a case where the process shown in FIG. 4 is started, the FPGA determines whether or not the mask signal is ON (S11). In a case where the mask signal is ON (S11: YES), the FPGA waits until the mask signal is turned off. In a case where the mask signal is turned off and the mask is removed (S11: NO), the FPGA sets the initial flag to 1 (S12), and starts time measurement using a timer (not illustrated) (S13). Then, the FPGA determines whether or not the time T2 has passed by the time measurement of the timer (S14). In a case where the time T2 has not passed (S14: NO), the FPGA waits until the time T2 passes. This time T2 is the above-described interval, and is, for example, 30 μs.

In a case where the interval of time T2 has passed (S14: YES), the FPGA starts time measurement using a timer (S15), and acquires information regarding the impedance, that is, parameters for calculating the impedance on the load 7 side, from the high frequency detection unit 6 (S16). Then, the FPGA calculates the impedance on the load 7 side using the acquired parameters (S17), and averages the calculated impedance in a sequential manner (S18). One calculation of the impedance ends within a time of 100 ns or less, for example. Then, the FPGA determines whether or not the time T3 has passed by the time measurement of the timer (S19). In a case where the time T3 has not passed (S19: NO), the process proceeds to step S16. This time T3 is, for example, 15 s.

In a case where the time T3 has elapsed (S19: YES), the FPGA outputs the averaged impedance on the load 7 side (more specifically, data indicating the impedance) to the CPU (S20). Then, the FPGA determines whether or not the initial flag is set to 1 (S21). In a case where the initial flag is set to 1 (S21: YES), that is, in a case where the calculation and averaging of the impedance end first, the FPGA sets the impedance update flag to 1 (S22) and clears the initial flag to 0 (S23).

In a case where the processing of step S23 ends or in a case where the initial flag is not set to 1 in step S21 (S21: NO), the FPGA determines whether or not the mask signal is ON (S24). In a case where the mask signal is not still ON (S24: NO), the process proceeds to step S15 to repeat the calculation and averaging of the impedance on the load 7 side. On the other hand, in a case where the mask signal is turned on to perform masking again (S24: YES), the FPGA ends the process shown in FIG. 4.

In addition, parameters for calculating the reflection coefficient may be acquired in step S16, reflection coefficients when the load side is viewed may be calculated in step S17, the reflection coefficients may be averaged in step S18, and the averaged reflection coefficient may be output in step S20.

In a case where the process shown in FIG. 5 is started, the CPU determines whether or not the impedance update flag is set to 1 (S31). In a case where the impedance update flag is not set to 1 (S31: NO), the CPU waits until the impedance update flag is set to 1. On the other hand, in a case where the impedance update flag is set to 1 (S31: YES), the CPU acquires the averaged impedance from the calculation unit 2 (S32), and calculates the capacitance of the variable capacitor 1 so that the impedance on the load 7 side matches the output impedance of the high frequency power supply 5 (S33). Then, the CPU determines ON/OFF states to be taken by the semiconductor switches 21, 22, . . . , 28 so that the capacitance of the variable capacitor 1 becomes the calculated capacitance (S34). Then, the CPU clears the update flag to 0 (S35), turns on the mask signal (S36), and ends the process shown in FIG. 5.

In addition, in a case where the reflection coefficient is output by the process illustrated in FIG. 4, the averaged reflection coefficient may be acquired in step S32 of FIG. 5, and the capacitance of the variable capacitor 1 may be calculated so that the reflection coefficient when the load 7 side is viewed approaches 0 in step S33.

In a case where the process illustrated in FIG. 6 is started, the CPU reads the ON/OFF states of the semiconductor switches 21, 22, . . . , 28 stored in a RAM (not illustrated) in the processing one period before (S41), and compares the read ON/OFF states with the ON/OFF states determined in step S34 of FIG. 5 (S42). Then, the CPU extracts bits that change from ON to OFF or from OFF to ON based on the comparison result (S43), and substitutes the number of changing bits for j (S44). Then, the CPU determines whether or not j is 0, that is, whether or not there is a changing bit (S45). In a case where j is 0 (S45: YES), the process proceeds to step S55, which will be described later, to turn off the mask signal. On the other hand, in a case where j is not 0 (S45: NO), the CPU initializes k to 8 (S46).

Then, the CPU determines whether or not Bk, which is the k-th bit among the semiconductor switches 21, 22, . . . , 28, is a bit that changes from ON to OFF or from OFF to ON (S47). In a case where Bk is not a changing bit (S47: NO), the CPU moves the processing to step S53, which will be described later, to search for a changing bit. On the other hand, in a case where Bk is a changing bit (S47: YES), the CPU starts time measurement using a timer (not illustrated) (S48), and actually performs ON/OFF switching of the k-th semiconductor switch corresponding to Bk (S49).

Then, the CPU decrements j by 1 (S50), and determines whether or not j is 0, that is, whether or not the number of remaining bits that change is 0 (S51). In a case where j is not 0 (S51: NO), the CPU determines whether or not the time T1 has passed by the time measurement of the timer (S52). In a case where the time T1 has not passed (S52: NO), the CPU waits until the time T1 passes. This time T1 is 4 μs at the shortest as described above, and is a time difference in the case of controlling the ON/OFF states of the semiconductor switches 21, 22, . . . , 28 bit by bit. In a case where the time T1 has passed (S52: YES), the CPU decrements k by 1 (S53), and then moves the processing to step S47 to further search for a changing bit.

In a case where j is 0 in step S51 (S51: YES), that is, in a case where the number of remaining bits that change is 0, the CPU stores the ON/OFF states of the semiconductor switches 21, 22, ..., 28 after switching (S54), and further turns off the mask signal (S55) to end the process illustrated in FIG. 6. The ON/OFF states stored herein are read in step S41 in the next one period. In addition, the ON/OFF states after switching stored in step S54 match the ON/OFF states determined in step S34 of FIG. 5.

In the flowchart illustrated in FIG. 6 described above, bits that change from ON to OFF or from OFF to ON among the semiconductor switches 21, 22, ..., 28 are extracted, and ON/OFF of the semiconductor switches 21, 22, ..., 28 is switched only for the extracted bits. However, the invention is not limited to this. For example, regardless of whether or not each bit of the semiconductor switches 21, 22, ..., 28 changes, ON/OFF of the semiconductor switches 21, 22, ..., 28 may be newly set for all the bits.

Specifically, among the steps illustrated in FIG. 6, steps S41 to 43, S45, and S47 may be deleted (the process proceeds to the next numbered step), and 8 (the total number of bits) may be substituted for j in step S44, and ON/OFF may be newly set for the k-th semiconductor switch corresponding to Bk in step S49.

As described above, according to the first embodiment, the variable capacitor 1 in which a series circuit of the capacitor 11 and the semiconductor switch 21, a series circuit of the capacitor 12 and the semiconductor switch 22, ..., a series circuit of the capacitor 18 and the semiconductor switch 28 are connected in parallel is provided between the high frequency power supply 5 and the load 7. Then, parameters regarding the impedance when the load 7 side is viewed from the output end of the high frequency power supply 5 or the input end of the impedance matching device are acquired from the high frequency detection unit 6 (step S16), and the current impedance or reflection coefficient on the load 7 side is calculated using the acquired parameters (step S17). In a case where the impedance on the load 7 side is calculated, in order to adjust the capacitance of the variable capacitor 1 so that the impedance on the load 7 side after adjustment approaches the output impedance of the high frequency power supply 5, ON/OFF states to be taken by the semiconductor switches 21, 22, ..., 28 are determined (step S34). On the other hand, in a case where the reflection coefficient is calculated, in order to adjust the capacitance of the variable capacitor 1 so that the actual reflection coefficient approaches 0, ON/OFF states to be taken by the semiconductor switches 21, 22, ..., 28 are determined. Then, in the case of newly adjusting the actual ON/OFF states of the semiconductor switches 21, 22, ..., 28 to ON or OFF so as to correspond to the determined ON/OFF state, a time difference is set for the ON/OFF control timing between adjacent bits (corresponding to a part and another part) of all of the semiconductor switches 21, 22, ..., 28 (step S52). Then, for example, between the semiconductor switches 21, 22, ..., 28 that may lead to unstable operation during ON/OFF control due to the arrangement relationship of the inductors FL in the impedance matching device 100, the ON/OFF control timings do not match each other. Therefore, it is possible to prevent an unstable ON/OFF operation due to noise of the semiconductor switches 21, 22, ..., 28 for switching the high frequency signal.

In addition, according to the first embodiment, for the ON/OFF control timings of all of the semiconductor switches 21, 22, ..., 28, the time difference of time T1 is sequentially set (step S52). Therefore, since no two semiconductor switches are controlled to be turned on or off at the same time, it is possible to prevent the controls from interfering with each other.

In addition, according to the first embodiment, the current ON/OFF states of the semiconductor switches 21, 22, ..., 28 are stored (step S54). By comparing the stored ON/OFF states with the determined ON/OFF states (step S42), semiconductor switches whose ON/OFF states are to be changed are extracted (step S43). Then, a time difference is set for the ON/OFF control timing between a part and another part of the extracted semiconductor switches (step S52). Therefore, only for semiconductor switches whose ON/OFF states change, a time difference in ON/OFF control is set. As a result, in a case where there are a small number of semiconductor switches whose ON/OFF states change, it is possible to shorten the total time required to change the states.

In addition, according to the first embodiment, at least some of the capacitors 11, 12, ..., 18 included in the variable capacitor 1 have stepwise different capacitances. Therefore, the adjustment range of the capacitance by the combination of the capacitors 11, 12, ..., 18 connected in parallel can be made relatively large.

In addition, according to the first embodiment, among the capacitors 11, 12, ..., 18 included in the variable capacitor 1, the semiconductor switches 21, 22, ..., 28 are controlled to be turned on or off from the most significant bit having the largest capacitance, or the semiconductor switches 21, 22, ..., 28 are controlled to be turned on or off from the least significant bit having the smallest capacitance. In a case where the semiconductor switches 21, 22, ..., 28 are controlled to be turned on or off from the most significant bit, the capacitance of the variable capacitor 1 can be adjusted so as to converge toward the target capacitance. In a case where the semiconductor switches 21, 22, ..., 28 are controlled to be turned on or off from the least significant bit, the capacitance of the variable capacitor 1 can be quickly adjusted toward the target capacitance in a region where the change in the target capacitance is small.

Second Embodiment

In the first embodiment, ON/OFF of the semiconductor switches 21, 22, ..., 28 is sequentially switched or set with a time difference of time T1 from the most significant bit or the least significant bit. On the other hand, in a second embodiment, ON/OFF of the semiconductor switches 21, 22, ..., 28 is switched or set separately for odd-numbered bits and even-numbered bits. Since the block configuration of an impedance matching device according to the second embodiment is the same as that in the case of the first embodiment, the corresponding portions are denoted by the same reference numerals, and the description thereof will be omitted.

Figure 7:
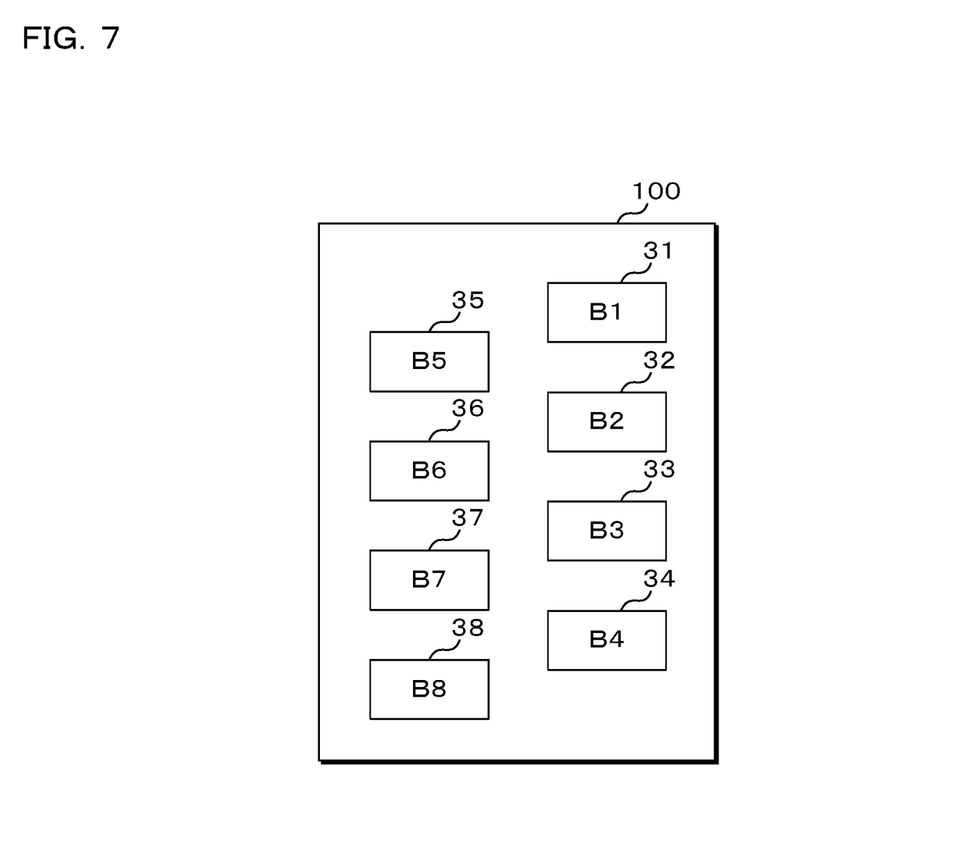
FIG. 7 is an explanatory diagram schematically illustrating an example of the arrangement of driving circuits in an impedance matching device according to a second embodiment.

FIG. 7 is an explanatory diagram schematically illustrating an arrangement example of driving circuits 31, 32, ..., 38 in an impedance matching device 100 according to the second embodiment. The driving circuits 31, 32, 33, and 34 for driving semiconductor switches 21, 22, 23, and 24 having bit numbers B1 to B4 are arranged in a vertical row in ascending order of the bit numbers. In addition, the driving circuits 35, 36, 37, and 38 for driving semiconductor switches 25, 26, 27, and 28 having bit numbers B5 to B8 are arranged in a vertical row in ascending order of the bit numbers. These two rows of driving circuits 31, 32, 33, and 34 and driving circuits 35, 36, 37, and 38 are arranged substantially in parallel.

In the case of the arrangement described above, inductors FL and FL may interfere with each other between driving circuits corresponding to adjacent bit numbers (B1 and B2, B2 and B3, B3 and B4, B5 and B6, B6 and B7, and B7 and B8). In addition, the inductors FL and FL may not interfere with each other between driving circuits arranged in different rows (row of B1 to B4 and row of B5 to B8). Therefore, in the second embodiment, the semiconductor switches 21, 23, 25, and 27 having odd-numbered bits and the semiconductor switches 22, 24, 26, and 28 having even-numbered bits are switched or set to ON/OFF with a time difference of time T1.

Figure 8:
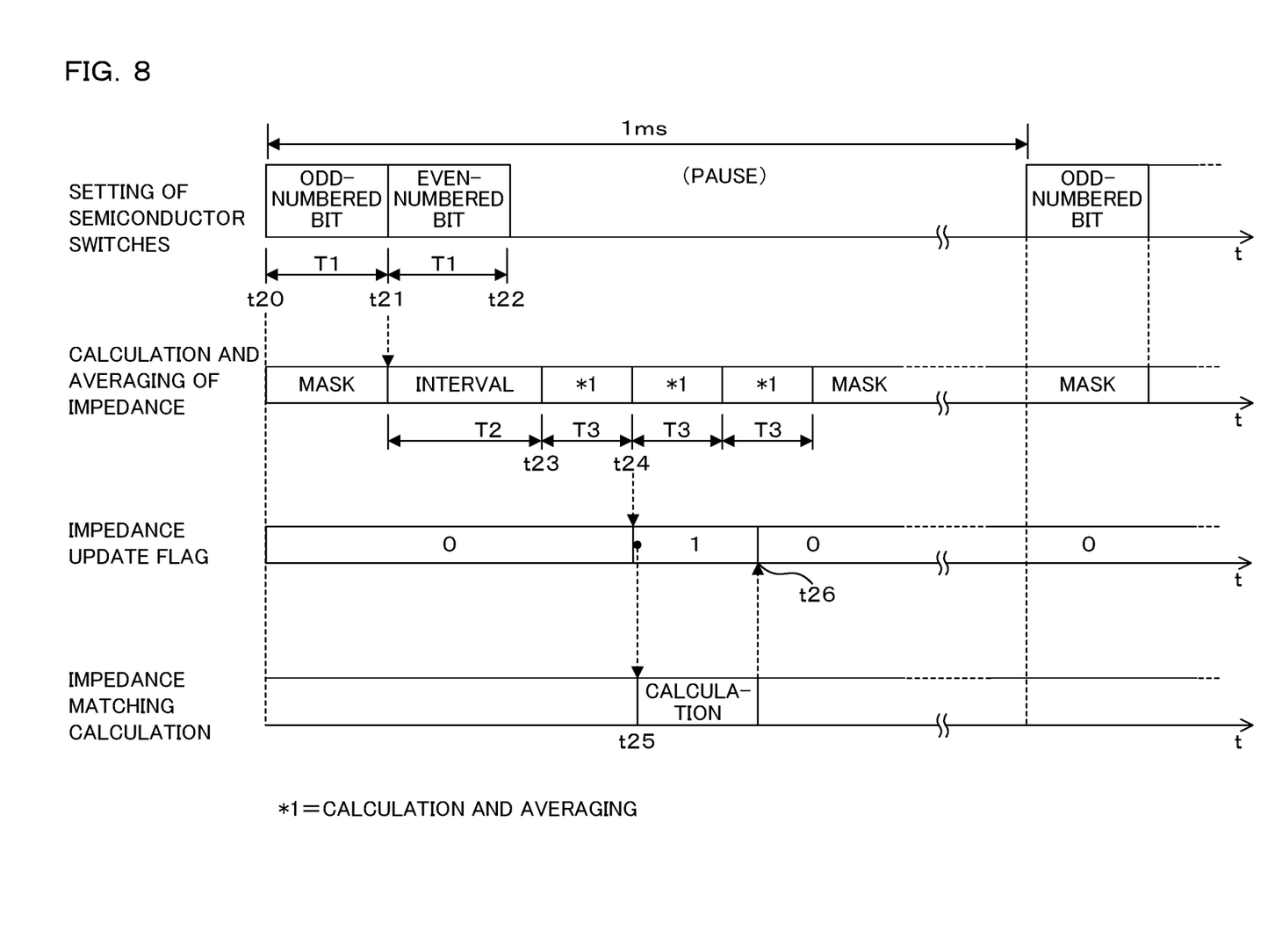
FIG. 8 is a timing chart showing the operation of the impedance matching device according to the second embodiment.

FIG. 8 is a timing chart showing the operation of the impedance matching device 100 according to the second embodiment. The four timing charts shown in FIG. 8 all have the same time axis (t) as the horizontal axis. In order from the top, timings for performing setting of the semiconductor switches 21, 22, . . . , 28, calculation and averaging of the impedance on the load 7 side, setting and clearing of an impedance update flag, and impedance matching calculation are schematically shown. The subject (FPGA of the calculation unit 2 and CPU of the control unit 3) that performs an operation corresponding to the timing chart shown in FIG. 8 is the same as that in the case of the first embodiment.

The settings of the semiconductor switches 21, 22, . . . , 28 performed from time t20 to t22 are executed by the CPU every time T1 according to the ON/OFF state determined in the immediately preceding period starting 1 ms before the time t20. Here, the semiconductor switches 21, 23, 25, and 27 having odd-numbered bits are set first, and the semiconductor switches 22, 24, 26, and 28 having even-numbered bits are set later. However, the semiconductor switches 22, 24, 26, and 28 having even-numbered bits may be set first. Alternatively, all the semiconductor switches 21, 22, . . . , 28 may be divided into two or more arbitrary groups, and the semiconductor switches may be sequentially set in units of groups every time T1.

The CPU turns off the mask signal when the settings of the semiconductor switches 22, 24, 26, and 28 having even-numbered bits executed at time t21 are completed. One FPGA sets an interval of time T2 from when the mask signal is turned off to when the calculation and averaging of the impedance on the load 7 side are started. In a case where the above interval ends at time t23, the FPGA acquires a parameter for calculating the impedance on the load 7 side from the high frequency detection unit 6 multiple times during time T3, and calculates and averages the impedance on the load 7 side each time the parameter is acquired. In a case where the first calculation and averaging end at time t24, the FPGA sets the impedance update flag cleared by the CPU before time t20 to 1.

In a case where the impedance update flag is set to 1 at the start of the calculation period starting from time t25, the other CPU performs an impedance matching calculation, determines ON/OFF states to be taken by the semiconductor switches 21, 22, . . . , 8, and clears the impedance update flag to 0 at time t26 when the calculation ends. Other timings other than those described above are the same as those shown in FIG. 3 of the first embodiment.

Figure 9:
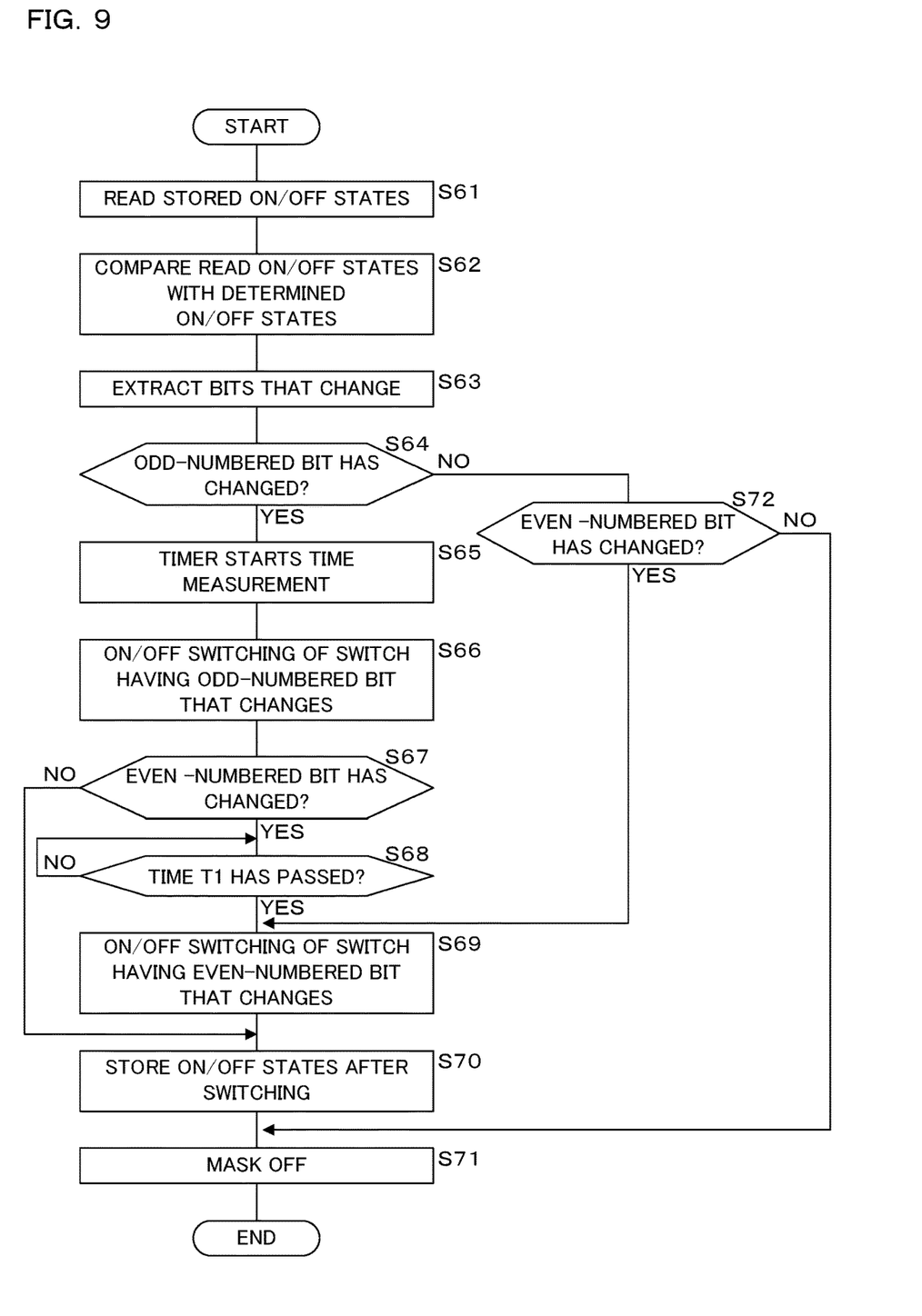
FIG. 9 is a flowchart illustrating the processing procedure of a CPU for switching ON/OFF of semiconductor switches in the impedance matching device according to the second embodiment.

Hereinafter, among the operations of the calculation unit 2 and the control unit 3 described above, the operation of the control unit 3 for setting the semiconductor switches 21, 22, . . . , 28 will be described with reference to the flowchart illustrating the operation. Since the operation of the calculation unit 2 and the operation of the control unit 3 that performs an impedance matching calculation are the same as those in the case of the first embodiment, the description thereof will be omitted herein. FIG. 9 is a flowchart illustrating the processing procedure of the CPU for switching ON/OFF of the semiconductor switches 21, 22, . . . , 28 in the impedance matching device 100 according to the second embodiment. The process shown in FIG. 9 is started, for example, every 1 ms and executed by the CPU of the control unit 3.

In a case where the process shown in FIG. 9 is started, the CPU reads the ON/OFF states of the semiconductor switches 21, 22, . . . , 28 stored in a RAM (not illustrated) in the processing one period before (S61), and compares the read ON/OFF states with the ON/OFF states determined immediately before time t26 in the impedance matching calculation (S62). Then, the CPU extracts bits that change from ON to OFF or from OFF to ON based on the comparison result (S63).

Then, the CPU determines whether any of the odd-numbered bits of the semiconductor switches 21, 22, . . . , 28 has changed from ON to OFF or from OFF to ON (S64). In a case where there is a change (S64: YES), the CPU starts time measurement using a timer (S65), and actually performs ON/OFF switching of the semiconductor switch having an odd-numbered bit that changes (S66).

Then, the CPU determines whether any of the even-numbered bits of the semiconductor switches 21, 22, . . . , 28 has changed from ON to OFF or from OFF to ON (S67). In a case where there is a change (S67: YES), the CPU determines whether or not the time T1 has passed by the time measurement of the timer (S68). In a case where the time T1 has not passed (S68: NO), the CPU waits until the time T1 passes. This time T1 is 4 μs at the shortest as described above, and is a time difference in the case of controlling the ON/OFF states of the semiconductor switches 21, 22, . . . , 28 separately for odd-numbered bits and even-numbered bits.

In a case where the time T1 has passed (S68: YES), the CPU actually performs ON/OFF switching of the semiconductor switch having an even-numbered bit that changes (S69). In a case where the processing of step S69 ends or in a case where there is no change in any of the even-numbered bits in step S67 (S67: NO), the CPU stores the ON/OFF states of the semiconductor switches 21, 22, . . . , 28 after switching (S70), and further turns off the mask signal (S71) to end the process shown in FIG. 9. The ON/OFF states stored herein are read in step S61 in the next one period.

In a case where there is no change in any of the odd-numbered bits in step S64 (S64: NO), the CPU determines whether any of the even-numbered bits of the semiconductor switches 21, 22, . . . , 28 has changed from ON to OFF or from OFF to ON (S72). In a case where there is a change (S67: YES), the CPU moves the processing to step S69 to perform ON/OFF switching of the semiconductor switch having an even-numbered bit that changes. On the other hand, in a case where there is no change in any of the even-numbered bits (S72: NO), the CPU moves the processing to step S71 to turn off the mask signal.

In the flowchart illustrated in FIG. 9 described above, bits that change from ON to OFF or from OFF to ON among the semiconductor switches 21, 22, . . . , 28 are extracted, and ON/OFF of the semiconductor switches 21, 22, . . . , 28 is switched only for the extracted bits. However, the invention is not limited to this. For example, regardless of whether or not each bit of the semiconductor switches 21, 22, . . . , 28 changes, ON/OFF of the semiconductor switches 21, 22, . . . , 28 may be newly set for all of the odd-numbered bits and the even-numbered bits.

Specifically, among the steps shown in FIG. 9, steps S61 to 64, S67, and S72 may be deleted (the process may proceed to the next numbered step), and ON/OFF may be newly set for the semiconductor switches 21, 23, 25, and 27 having odd-numbered bits in step S66 and ON/OFF may be newly set for the semiconductor switches 22, 24, 26, and 28 having even-numbered bits in step S69.

As described above, according to the second embodiment, in the case of newly adjusting the actual ON/OFF states of the semiconductor switches 21, 22, ..., 28 to ON or OFF so as to correspond to the determined ON/OFF state (steps S66 and S69), a time difference is set for the ON/OFF control timing between the semiconductor switches 21, 23, 25, and 27 having odd-numbered bits and the semiconductor switches 22, 24, 26, and 28 having even-numbered bits (corresponding to a part and another part) (step S68). Then, for example, between the semiconductor switches 21, 23, 25, and 27 and the semiconductor switches 22, 24, 26, and 28 that may lead to unstable operation during ON/OFF control due to the arrangement relationship of the inductors FL in the impedance matching device 100, the ON/OFF control timings do not match each other. Therefore, it is possible to prevent an unstable ON/OFF operation due to noise of the semiconductor switches 21, 22, ..., 28 for switching the high frequency signal.

It is to be noted that, as used herein and in the appended claims, the singular forms "a", "an", and "the" include plural referents unless the context clearly dictates otherwise.

The embodiments disclosed this time are to be considered in all respects as illustrative and not restrictive. The scope of the invention is indicated not by the meaning described above but by the scope of the claims, and includes all changes within the meaning and scope equivalent to the scope of the claims. In addition, the technical features described in the respective embodiments can be combined with each other.

What is claimed is:

1. An impedance matching device that is provided between a high frequency power supply and a load and acquires information regarding an impedance as the load side is viewed from an output end of the high frequency power supply or a portion equivalent to the output end and performs impedance matching between the high frequency power supply and the load, the device comprising:
    a variable capacitor in which a plurality of series circuits of capacitors and semiconductor switches are connected in parallel;
    a calculation unit that calculates an impedance or a reflection coefficient on the load side using the acquired information regarding the impedance; and
    a control unit that determines ON/OFF states to be taken by the semiconductor switches included in the variable capacitor using the impedance or the reflection coefficient calculated by the calculation unit and changes the ON/OFF states of the semiconductor switches based on the determined states,
    wherein the control unit changes an ON/OFF control timing between one and another of the semiconductor switches, and
    wherein a time difference is set for the ON/OFF control timing between the semiconductor switches having odd numbered bits and the semiconductor switches having even numbered bits, wherein the ON/OFF control timings do not match each other.

2. The impedance matching device according to claim 1, wherein the control unit changes an ON/OFF timing by a predetermined time for each of the semiconductor switches whose ON/OFF states are to be changed.

3. The impedance matching device according to claim 1, wherein the control unit stores ON/OFF states of the semiconductor switches, extracts semiconductor switches whose ON/OFF states are to be changed based on the stored ON/OFF states and the determined ON/OFF states, and changes an ON/OFF timing between one and another of the extracted semiconductor switches.

4. The impedance matching device according to claim 1, wherein some or all of the capacitors included in the variable capacitor have stepwise different capacitances.

5. The impedance matching device according to claim 4, wherein the control unit turns on or off corresponding semiconductor switches in descending or ascending order of the capacitances of the capacitors.

6. An impedance matching method for performing impedance matching between a high frequency power supply and a load using a variable capacitor which is provided between the high frequency power supply and the load and in which a plurality of series circuits of capacitors and semiconductor switches are connected in parallel, the method comprising:
    acquiring information regarding an impedance as the load side is viewed from an output end of the high frequency power supply or a portion equivalent to the output end;
    calculating an impedance or a reflection coefficient on the load side using the acquired information regarding the impedance;
    determining ON/OFF states to be taken by the semiconductor switches included in the variable capacitor using the calculated impedance or reflection coefficient;
    changing an ON/OFF control timing between one and another of the semiconductor switches in the case of changing the ON/OFF states of the semiconductor switches based on the determined states; and
    setting a time difference for the ON/OFF control timing between the semiconductor switches having odd numbered bits and the semiconductor switches having even numbered bits, wherein the ON/OFF control timings do not match each other.

* * * * *